United States Patent
Meng

(10) Patent No.: US 7,114,361 B2
(45) Date of Patent: Oct. 3, 2006

(54) MICROSCALE COMPRESSION MOLDING OF METALS WITH SURFACE ENGINEERED LIGA INSERTS

(75) Inventor: Wen Jin Meng, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 403 days.

(21) Appl. No.: 10/660,926

(22) Filed: Sep. 12, 2003

(65) Prior Publication Data

US 2005/0056074 A1    Mar. 17, 2005

(51) Int. Cl.
*B21D 22/00* (2006.01)
(52) U.S. Cl. .......................... 72/352; 72/364; 72/379.2
(58) Field of Classification Search .................. 72/352, 72/364, 370.04, 379.2; 428/612
See application file for complete search history.

(56) References Cited

U.S. PATENT DOCUMENTS

| | | | |
|---|---|---|---|
| 5,681,661 A * | 10/1997 | Kelly | 428/601 |
| 5,787,753 A * | 8/1998 | Dougherty | 72/352 |
| 6,280,090 B1 * | 8/2001 | Stephens et al. | 384/284 |
| 6,415,860 B1 * | 7/2002 | Kelly et al. | 165/148 |
| 6,688,154 B1 * | 2/2004 | Anazawa et al. | 72/359 |
| 6,892,802 B1 * | 5/2005 | Kelly et al. | 165/148 |

OTHER PUBLICATIONS

Cao et al., "Amorphous Hydrocarbon based Thin Films for High-aspect-ratio MEMS Applications," Thin Solid Films, vol. 398/399, pp. 553-559 (2001).

Cao et al., "Microscale Compression Molding of Al with Surface Engineered LIGA Inserts," submitted for publication in Jun. 2003.

Cao et al., "Molding of Pb and Zn with Microscale Mold Inserts," presented at the Materials Research Society Meeting, Boston, Massachusetts (Dec. 2002).

Harris, C. et al., "Design and Fabrication of a Cross Flow Micro Heat Exchanger," IEEE J. Microelectromech. Syst., vol. 9, No. 4, pp. 502-508 (2000).

Stephens, L.S. et al., "A Pin Fin Microheat Sink for Cooling Macroscale Conformal Surfaces Under the Influence of Thrust and Frictional Forces," IEEE J. Microelectromech. Syst., vol. 10, No. 2, pp. 222-231 (2001).

Weber, L. et al., "Micromolding: a powerful tool for large-scale production of precise microstructures," SPIE Proceeding, Micromachining and Microfabrication Process Technology II, Austin, TX, pp. 156-167 (1996).

* cited by examiner

*Primary Examiner*—Dmitry Suhol
(74) *Attorney, Agent, or Firm*—John H. Runnels; Bonnie J. Davis; André J. Porter

(57) ABSTRACT

An inexpensive method of rapidly fabricating reactive metal (Zn, Al, Al-alloy, etc.) microscale structures including high-aspect-ratio microscale structures is disclosed. A high precision process uses conformal bond inhibitor coating and high temperature compression molding techniques to produce high quality, high aspect ratio metal structures. In one embodiment, following fabrication of an initial metallic microscale mold insert, an adhesion-promoting metal precursor layer and a ceramic bond inhibitor coating are conformally deposited onto the microscale mold insert. The microscale mold insert and a preselected reactive metal are then heated to an optimum temperature and compressed together. The mold insert is then extracted from the molded metal to produce a reverse image of the mold insert.

16 Claims, 15 Drawing Sheets

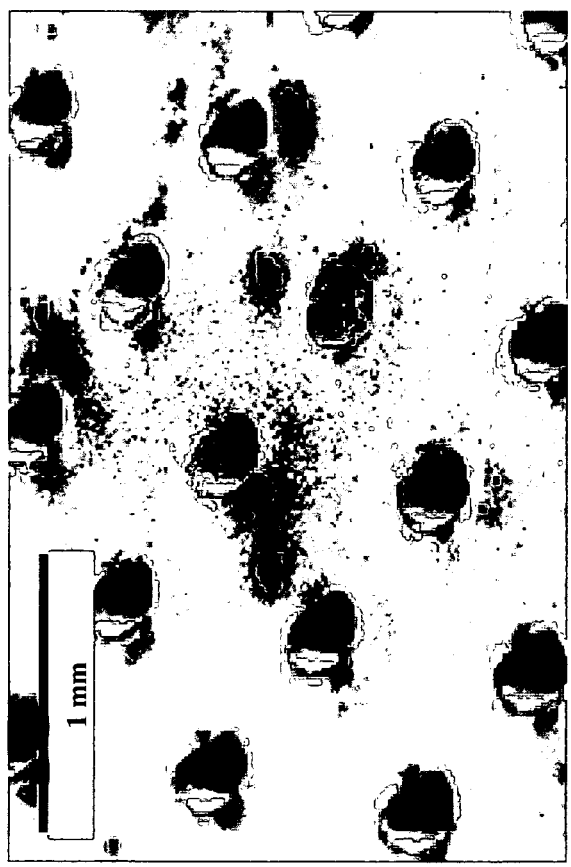
Fig. 4A
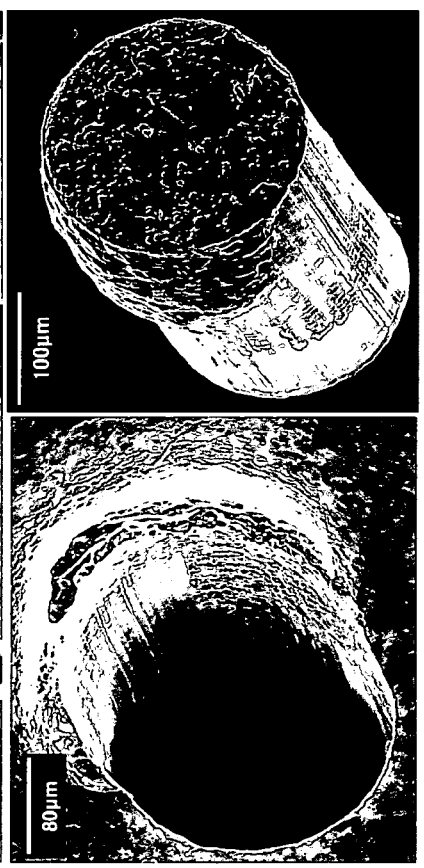
Fig. 4B
Fig. 4C

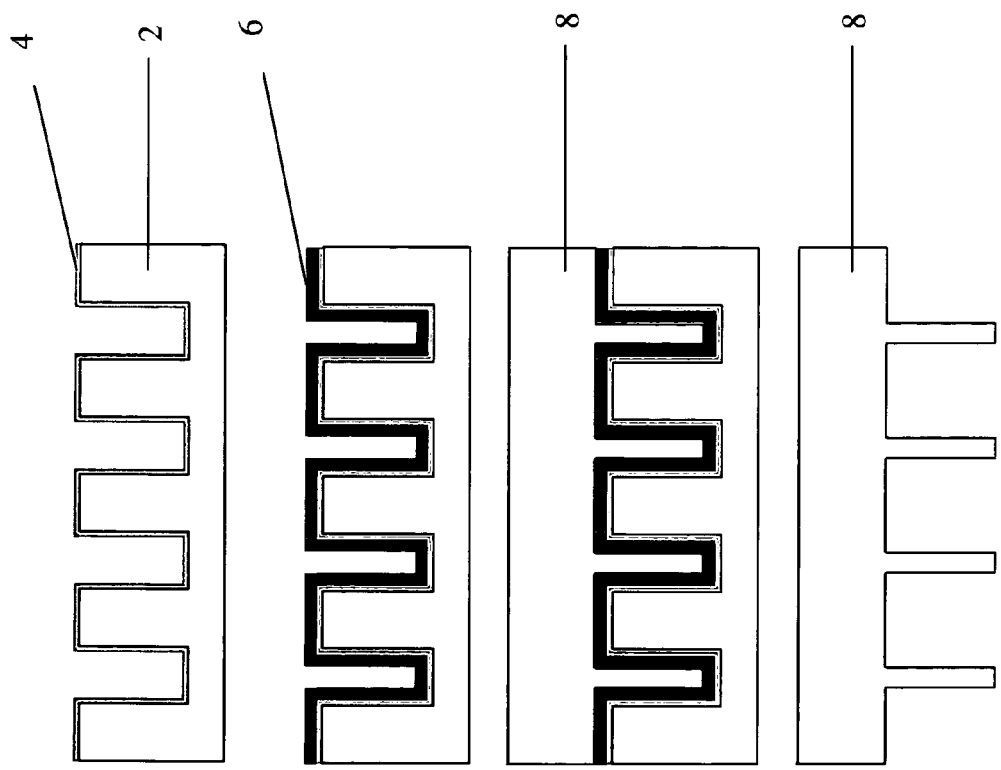

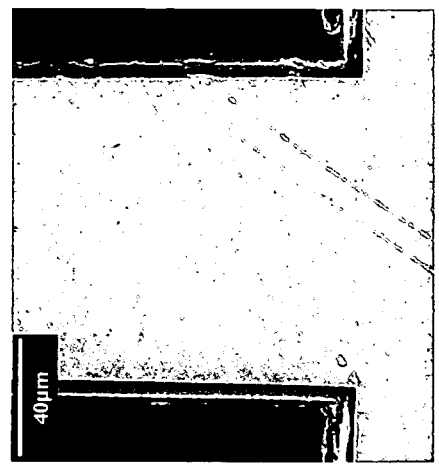
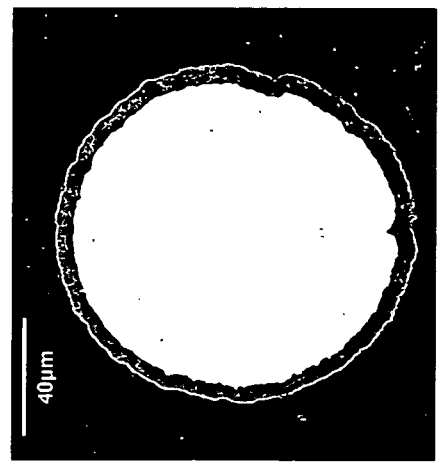
Fig. 9C
Fig. 9B
Fig. 9A

MICROSCALE COMPRESSION MOLDING OF METALS WITH SURFACE ENGINEERED LIGA INSERTS

This invention pertains to microstructures, particularly a method of high temperature micromolding of relatively reactive metals (e.g., Zn, Al, Al-alloys, etc.) to create high aspect ratio microscale structures ("HARMs").

In the last few years, research has been very active on low-cost, mass production microfabrication techniques for manufacturing microdevices for electrical, biochemical, and mechanical engineering applications. Commercial manufactures currently use metallic and ceramic microscale mold inserts to replicate polymeric microscale structures. Metallic microscale mold inserts are generally fabricated using a LIGA process, while ceramic microscale mold inserts are fabricated using a ceramic casting or sintering process. ("LIGA" is a German acronym for "lithography, electrodeposition, and molding.") The LIGA process, based on deep X-ray lithography and electrodeposition, is a well-known technique that makes it possible to create HARMs having high aspect ratios of up to approximately 100:1. By incorporating HARMs fabricated using the LIGA process into microscale mechanical devices, the performance of devices such as micro heat exchangers and temperature-controlled mechanical seals may be enhanced. For example, in micro heat exchanger applications, HARMs fabricated with high thermal conductivity/low mass density metals (e.g., Al and Al-alloys) can provide higher heat transfer per unit weight. In these microdevices, typical feature sizes are on the order of 100 to 1000 μm, preferably in the range of 200 to 500 μm. See C. Harris, et al., "Design and Fabrication of a Cross Flow Micro Heat Exchanger," *IEEE J. Microelectromech. Syst.* vol. 9, pg. 502 (2000); and L. S. Stephens, et al., "A Pin Fin Microheat Sink for Cooling Macroscale Conformal Surfaces Under the Influence of Thrust and Frictional Forces," *IEEE J. Microelectromech. Syst.*, vol. 10, pg. 222 (2001).

In the LIGA process, high energy X-ray radiation is used to perform deep lithography on resists, e.g., polymethyl methacrylate ("PMMA") and epoxy-based SU-8, up to a few millimeters in thickness. Once the exposed resist layer is developed, metals or alloys are electrodeposited into the resist structure and the remaining resist is chemically dissolved to produce either a final HARMs product or a metallic microscale mold insert. (The mold insert may be used to replicate secondary HARMs using a compression molding process.) While conventional LIGA, in many instances, is a preferred method of fabricating HARMs, it requires access to a synchrotron radiation source, which is generally undesirable in mass reproduction due to costs associated with building and maintaining a synchrotron radiation facility. See L. Weber, et al., *SPIE Proceeding, Micromachining* and *Microfabrication Process Technology II*, pg. 156 (Austin, Tex., 1996).

Currently, replication of reactive metal HARMs by compression molding metals with LIGA-fabricated inserts is not possible. This limits the ability to fabricate HARMs-based mechanical devices (e.g., micro heat exchangers). Major obstacles to compression molding of reactive metals with metallic mold inserts include the chemical and the mechanical interactions between the metals and the metallic mold insert. These interactions can cause reactive metals and metallic mold inserts to bond, often resulting in damage either to the mold insert, the molded metallic part, or both. Chemical and mechanical interactions between metals and metallic mold inserts depend on the chemical, the mechanical, and the tribological properties (e.g., chemical inertness or reactivity, hardness, coefficient of friction, and wear rate of the material) of the inserts' near-surface region. If the mechanical properties of the insert bulk are adequate, high temperature (between about 100° C. to about 800° C.) micromolding may be achieved by altering the chemical and the mechanical interactions between the insert and the molded metal. See Cao, et al., "Amorphous Hydrocarbon based Thin Films for High-aspect-ratio MEMS Applications," *Thin Solid Films*, vol. 398/399, pp. 553–559 (2001).

Until recently, there were no methods for applying a protective coating onto a high aspect ratio microscale structure to improve its mechanical and tribological characteristics due to its small linear dimensions (~100 μm) and high aspect ratios (greater than ~4). This problem was addressed in D. M. Cao, et al. (2001) which discloses the use of a low-pressure, high-density, inductively coupled plasma ("ICP") assisted hybrid chemical vapor deposition ("CVD")/physical vapor deposition ("PVD") technique for improving the mechanical and the tribological characteristics of HARMs-based microdevices with moving parts by conformally depositing a thin film coating of Ti-containing hydrocarbon (Ti—C:H) onto the microdevices. The authors concluded that the structural integrity of the Ti—C:H coatings allowed freestanding, high-aspect-ratio structures to be fabricated out of vapor deposited nanostructured ceramics.

An unfilled need exists for a fast and inexpensive microfabrication technique for creating HARMs in reactive metals (e.g., Zn, Al, Al-alloy).

I have discovered an inexpensive method for rapid microfabrication of HARMs in reactive metals (e.g., Zn, Al, Al-alloy, etc.) using conformal bond inhibitor-coating and high temperature micromolding techniques. The novel method uses microscale mold inserts to produce high quality, high-aspect-ratio metal structures. In one embodiment, following the fabrication of an initial metallic microscale mold insert, an adhesion-promoting metal precursor layer (e.g., Ti, Cr, W, etc.) and a bond inhibitor coating are conformally deposited onto the microscale mold insert. The metal precursor promotes adhesion between the metallic microscale mold insert and the bond inhibitor by altering the mechanical and chemical properties of the interface between the mold insert and the bond-inhibitor layer. The microscale mold insert and a preselected reactive metal are next heated to an optimum temperature (between about 40% to about 90% of the metal's absolute melting temperature, i.e., the melting point expressed in degrees Kelvin) and then compressed together. The bond inhibitor layer allows the mold insert to be separated from the molded metal once the compression process is completed. The mold insert is then extracted from the molded metal to produce a reverse image of the mold insert.

BRIEF DESCRIPTION OF THE DRAWINGS

FIG. 4A is a scanning electron photomicrograph of an Al plate molded using an uncoated Ni insert after a single compression molding iteration.

FIG. 4B is a scanning electron photomicrograph of a single microhole of the molded Al plate shown in FIG. 4A.

FIG. 4C is a scanning electron photomicrograph of a single micropost from the uncoated Ni mold insert used to mold the Al plate shown in FIG. 4A.

FIGS. 6A–6D show a schematic diagram of a fabrication sequence for the production of metal high aspect ratio microscale structures.

FIGS. 9A–9C are cross-sectional scanning electron photomicrographs of the single micropost shown in FIGS. 8A–8C.

One purpose of this invention is to provide an inexpensive method for rapidly fabricating high-aspect-ratio microstructures for general mechanical applications using reactive metals with melting temperatures between about 300° C. to about 1600° C. such as Zn, Al, Al-alloys, Cu, Ni, Fe, and Ni—Fe alloys. When using techniques such as high temperature compression micromolding, it is essential that an inverse image of the initial microscale mold insert be created in the replication material with a high level of precision (preferably at the nanometer scale), while inhibiting chemical bonding between the mold insert and the replication material. High precision allows, for example, the assembling of multiple replicated HARMs parts in a functional microdevice. This is achieved by altering the chemical and the mechanical interactions between the microscale mold insert and the replicating material, using a conformally deposited bond-inhibitor layer. A variety of substrates can be used to prepare the microscale mold insert such as nickel, stainless steel, titanium, silicon, etc.

As used in the specification and claims, a "reactive" metal or alloy is one that reacts with or bonds to an uncoated metal micromold insert to an extent sufficient to cause substantial deformation of, or a substantial change in composition of, the components of the micromold insert, or of the metal or alloy component, following compression molding, all as compared to that which would result with a coated micromold insert as described here. Preferred bond inhibitors are amorphous hydrocarbons (a-C:H), metal-containing hydrocarbons (Me—C:H) such as a Ti-containing hydrocarbon (Ti—C:H), and other single phase and multi-phased nanostructured ceramics. In one embodiment, the mechanical and tribological properties of Ti—C:H coatings which have moderate hardness and low friction properties, depending on the detailed coating composition. When Ti—C:H coatings are applied to a microstructure, the coating undergoes a percolation-type transition, changing from a structure with isolated TiC nanocrystals embedded in an a-C:H matrix to a structure with coalescing TiC nanocrystalline clusters that permeate through the matrix and isolated a-C:H regions as the Ti composition is increased. An abrupt change from a low-friction, low-wear regime to a high-friction, high-wear regime is observed at the point of this structural transition. The surface chemical properties of the coated mold insert also change as the coating composition changes. Alternatively, metal-containing silicon nitride coatings (Me—Si—N) having high temperature and chemical stability, and high hardness (e.g., Ti—Si—N) may be used. Other bond inhibitors may include carbide materials (e.g., titanium carbide and boron carbide), boride materials (e.g., titanium diboride) and carbon-based materials (e.g., nanocrystalline diamond). See, e.g., D. M. Cao, et al. (2001).

EXAMPLE 1

Figure 1:
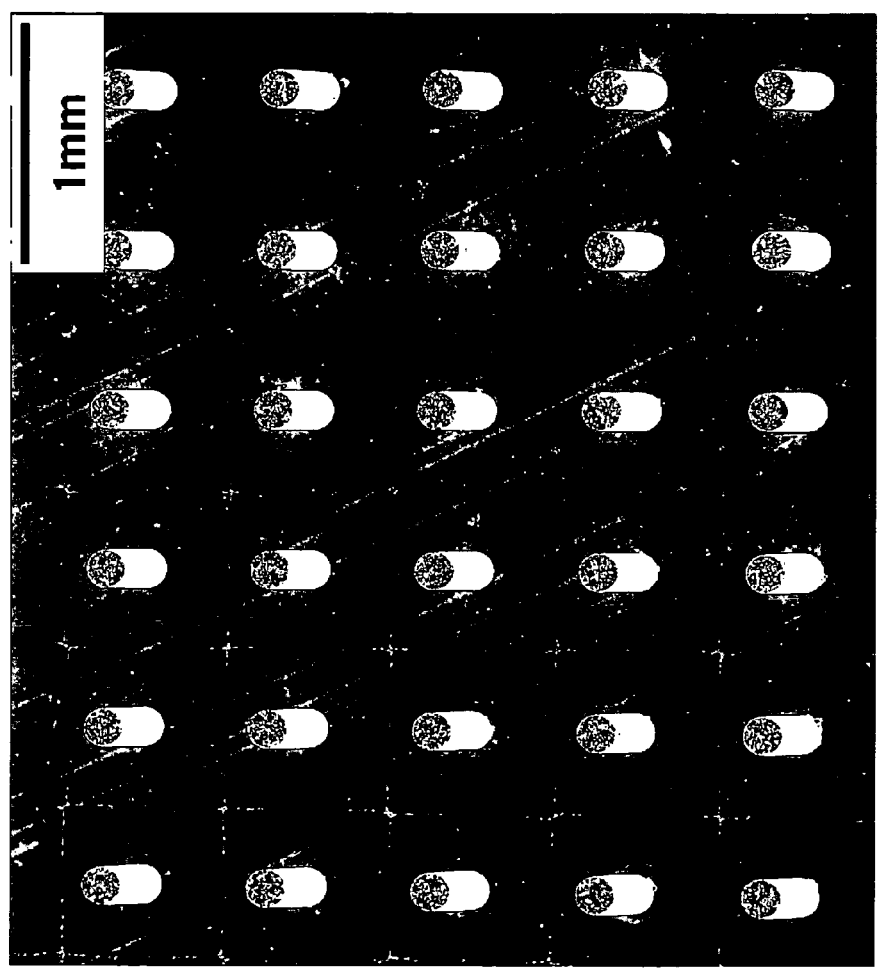
FIG. 1 is a scanning electron photomicrograph of an electroplated Ni mold insert.

FIG. 1 shows a portion of an electroplated Ni microscale mold insert comprising an array of cylindrical microposts, prepared using conventional LIGA techniques. (Other techniques can be used to prepare microscale mold inserts for use in accordance with this invention such as LIGA-like and silicon micromachined structures.) The insert had a total of 585 cylindrical microposts with dimensions of approximately 400 μm×200 μm×700 μm (height, diameter, and center-to-center spacing, respectively). The total lateral insert footprint of the microscale mold insert was approximately 1.8 cm×1.8 cm. The array of Ni microposts was surrounded by four support pads and a square support rim located at the outer most edges of the insert (not shown). The top of the supporting pads and rim had the same height as the microposts. A variety of substrates (e.g., nickel, stainless steel, titanium, silicon, etc.) can be used to prepare microscale mold inserts. When using non-conducting substrates (e.g., silicon wafers), various metal layers such as titanium/ copper and gold/titanium (typically sputter-coated) can be used as adhesion and electroplating seeding layers.

An X-ray mask was produced using a 200 μm thick graphite sheet as a membrane. A gold/titanium layer was first electron beam evaporated onto the graphite membrane to promote adhesion and improve electrical conductivity. An ~40 μm thick SU-8 photoresist was then spun onto the gold/titanium coated graphite membrane, patterned with an ultra-violet aligner, and developed by exposing it to a SU-8 developer solution. The SU-8 developer is a proprietary solution for developing SU-8 photoresists, and is distributed by the MicroChem Corporation (MicroChem Corporation, Newton, Mass.). An X-ray absorber was then produced by electroplating a ~25 μm thick gold layer onto the developed photoresist/graphite membrane. PMMA sheets (Goodfellow, Huntingdon, UK) having a thickness of ~500 μm were bonded to 304 stainless steel substrates and exposed to a synchrotron radiation source at 1.3 GeV in a chamber with a $2.7 \times 10^3$ Pa He atmosphere. During X-ray exposure, the top-to-bottom dose ratio for the PMMA sheets was controlled using a 6 μm thick Al filter. The X-ray dose at the bottom of the PMMA sheets was approximately 3000 J/cm$^3$, with a top-to-bottom dose ratio of approximately 4.4.

A patterned PMMA sheet was created by developing the exposed PMMA sheet in a GG developer and rinse recipe. A GG developer is an empirically-defined molecular weight-sensitive solvent comprising about 60% diethylene glycol butyl ether, about 20% morpholine, about 5% ethanolamine, and about 15% water. The rinse solution consists of about 80% 2-(2-Butoxyethoxy)ethanol and about 20% water. A 500 μm thick PMMA sheet was developed at 5 cycles for 20 min, followed by 40 min of rinsing. The patterned PMMA sheet was then electroplated in a nickel sulfamate solution in a potentiostatic mode at a potential of −0.85V versus saturated calomel electrode ("SCE"). The nickel sulfamate solution comprised 450 mL/L of $Ni(SO_3NH_2)_2$, 37.5 g/L of $H_3BO_3$, 3 g/L sodium lauryl sulfate, and deionized water, mixed with sulfuric acid or sodium hydroxide to produce a pH of approximately 4. Acetone was then used to strip away the remaining PMMA, leaving a high-aspect-ratio Ni microscale mold insert, as shown in FIG. 1. All Ni HARMs were cleaned in acetone and methanol prior to being used either directly as mold inserts or as substrates for coating with a bond-inhibitor.

Bond inhibitor-coated Ni HARMs substrates were created by first sputter-depositing a pure Ti interlayer onto the substrates, and then depositing a thin film (between about 0.1 μm to about 10 μm) top layer of Ti—C:H using an ICP-assisted hybrid CVD/PVD tool with a base pressure of ~1.7 mTorr and a total ICP input power of 1000 W. The hybrid tool combines a 13.56 MHz ICP with balanced magnetron sputter sources, which can be operated in a plasma-assisted CVD mode (i.e., no magnetrons), a magnetron-sputtering PVD mode (i.e., no ICP), or a hybrid mode (i.e., a mode that combines both the plasma-assisted CVD and the magnetron-sputtering PVD modes). Prior to the Ti—C:H deposition, the substrates were etched for 10 min in a 0.23 Pa Ar(99.999+%) plasma, with the total ICP input power at 1000 W and the substrate bias voltage at −100 V. All Ti—C:H depositions occurred in the hybrid mode, in which two magnetron sources sputtered two pure Ti cathodes (99.99+%) in an $Ar/C_2H_2$(99.99+%) ICP plasma. The ratio of Ar and $C_2H_2$ input flow rates was 5:3, with a Ti cathode current of 1.0 A. Neither substrate heating nor cooling was intentionally applied. The substrate temperature was estimated to be about 250° C. during deposition. X-ray photoelectron spectroscopy ("XPS") measurements of Ti—C:H coatings deposited on Si wafers showed that oxygen contamination was below 1 atomic percent and the Ti to C ratio in the Ti—C:H top layer was ~0.05 or less.

The following reactive metal HARMs were produced using Ni as the bulk material for a microscale mold insert. Microscale mold inserts should be designed to compensate for the thickness of the bond-inhibitor layer which overcoats the insert bulk. For example, if an original microscale mold insert with microposts having a diameter of 200 μm is coated with a 1 μm thick bond inhibitor layer, then the final replicated microholes will have a diameter 2 μm larger than the original. Thus, in order to produce final microholes, each having, for example, a 200 μm diameter, the original microscale mold insert should have 198 μm diameter cylindrical microposts to compensate for a 1 μm thick bond-inhibitor coating.

EXAMPLE 2

Al HARMs Fabricated Using a Bond Inhibitor-Coated Ni HARMs Insert

In one embodiment, Al HARMs were created using a compression molding process, which involved pressing a bond inhibitor-coated Ni microscale mold insert into an Al plate. Al compression molding was performed using a custom-built compression molding machine, comprising of a single-axis MTS858 testing system (MTS Systems Corporation, Eden Prairie, Minn.) interfaced with a high-vacuum chamber. This machine allows for the continuous measurement of the insert displacement and the total force applied to the insert. An Al plate (1100H14 alloy; 99% Al) having a 1.4 in dia and a 0.25 in thickness was attached to a custom-built heater rigidly fixed to the bottom half of the molding chamber. The Al plate was polished with SiC, 1200 grit size, abrasive paper. The bond inhibitor-coated Ni HARMs insert, fabricated using the process described in Example 1, was attached to a second custom-built heater, fixed to a vacuum bellow feed-through located at the top half of the molding chamber. The microscale mold insert and Al plate were heated to 462±5° C. and 400–450° C., respectively. (Both heaters were capable of reaching temperatures in excess of 700° C.) Both the insert temperature and the Al plate temperature were continuously monitored by separate K-type thermocouples (OMEGA Engineering, Inc., Stamford, Conn.). Al plate temperatures prior to molding are shown in Table 1. All Al micromolding experiments were performed at ambient gas pressures below ~$2 \times 10^{-4}$ Torr. Once the temperatures were stabilized, the Al plate was molded by pressing the bond inhibitor-coated Ni insert into it. After a desired molding depth was reached, the insert and the Al plate were demolded by separating the insert from the Al plate. The molding process comprised two steps, a molding step and a hold step. In the molding step (time 0 to ~1100 sec) the insert was pressed into the Al plate at a constant loading rate of 100 N/min, resulting in an insert displacement rate of ~24 μm/min. The hold step, which involved maintaining a constant-force on the insert for 300 sec, was initiated when the measured insert displacement reached 400 μm. (The hold force was approximately equal to the maximum holding force, as shown in Table 1.) After the hold step was completed, the insert was withdrawn from the molded Al plate at a constant displacement rate of 1000 μm/min for a total distance of 6000 μm, and held at this position for a period of 2 min.

TABLE 1

| Insert/ Molding Cycle | Al Plate Temperature (° C.) | Maximum Molding Force (N) | Total Work of Molding Process (N*mm) | Maximum Demolding Force (N) |
|---|---|---|---|---|
| CI/1st | 433 | 1627 | 341 | 189 |
| CI/2nd | 459 | 1732 | 345 | 204 |
| CI/3rd | 457 | 1677 | 368 | 223 |
| CI/4th | 458 | 1644 | 346 | 225 |
| UCI/1st | 460 | 1790 | 389 | 582 |

Measured parameters of Al micromolding runs with one Ti—C:H coated Ni insert (CI) and one uncoated Ni insert (UCI).

Figure 2:
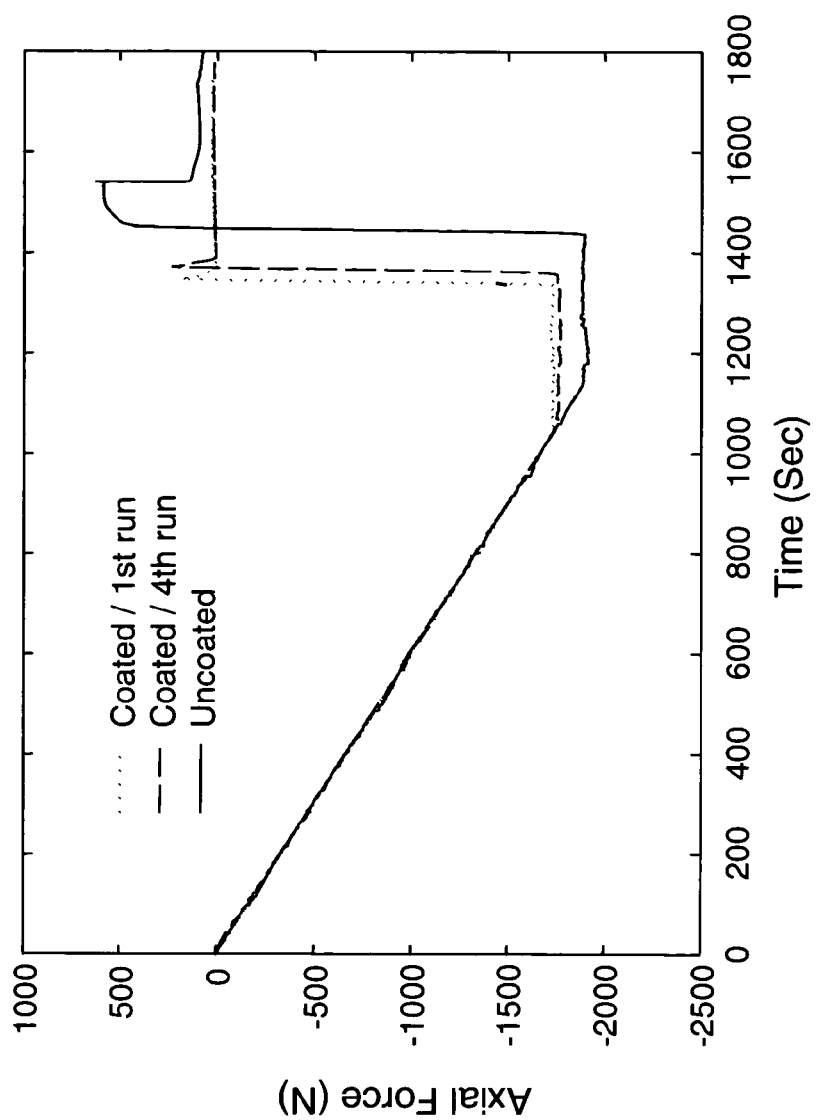
FIG. 2 is a graph plotting the axial force exerted on coated and uncoated mold inserts during an Al molding and demolding process.

Withdrawal of the coated Ni insert from the Al plate led to a rapid change in the total force exerted on the insert (from compressive to tensile), as shown in FIG. 2. The tensile force during insert extraction began at a maximum level, but decreased continuously over a ~21 sec period to produce a slowly varying background force. This background force, which was caused by the stretching of the vacuum feed-through bellow after the coated insert separated from the Al plate, varied with insert displacement by about 3 N/mm. During the final hold step, the insert displacement and total force remained constant.

As shown in FIG. 2, the same bond-inhibitor coated Ni insert was used to mold Al HARMs repeatedly. No significant increase in either the maximum molding force or the maximum demolding force was observed. The demolding behavior also remained unchanged.

Figure 3B:
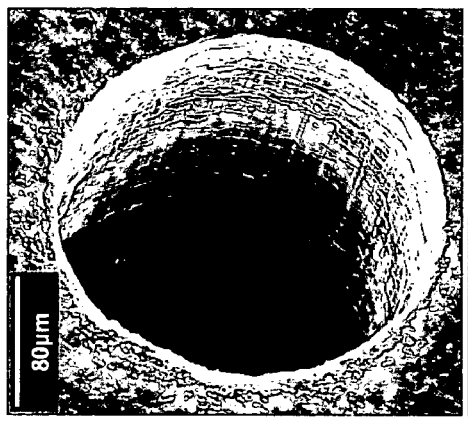
FIG. 3B is a scanning electron photomicrograph of a single microhole from the Al plate shown in FIG. 3A.
Figure 3C:
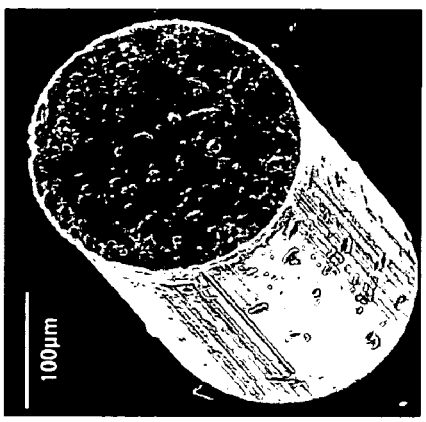
FIG. 3C is a scanning electron photomicrograph of a single micropost from the coated Ni mold insert used to mold the Al plate shown in FIG. 3A.
Figure 3A:
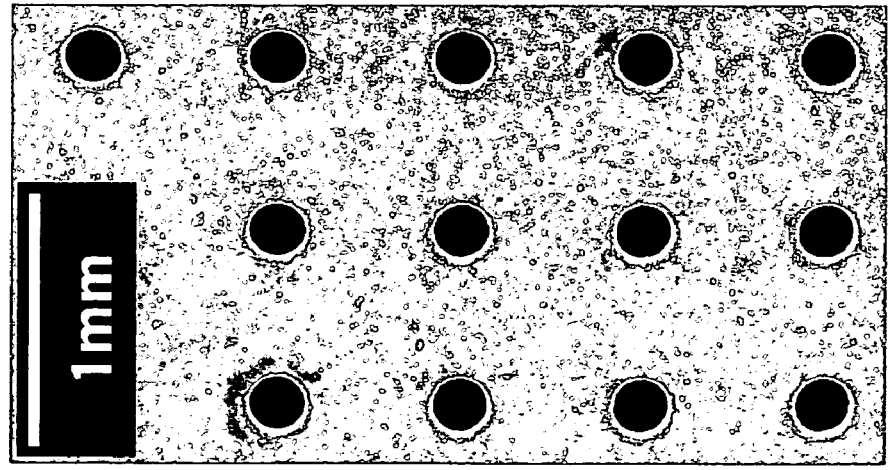
FIG. 3A is a scanning electron photomicrograph of an Al plate molded with a coated Ni mold insert after a fourth compression molding iteration.

FIG. 3A shows one embodiment of an Al plate molded with a bond inhibitor-coated Ni insert after a fourth compression molding iteration. The geometric features on the insert, square array of cylindrical microposts, were replicated with precision into a square array of Al microholes. The microholes, as shown in FIG. 3B, had smooth sidewalls, a sharp top rim, and abrupt sidewall-to-bottom transitions. A minimal amount of deformation and material pickup were observed on the micropost, as shown in FIG. 3C. No coating delamination from the Ni micropost was observed. Optical profilometry measurements showed microholes with depths of ~400 mm, which indicated that 100% molding occurred.

EXAMPLE 3

Al HARMs Fabricated Using a Ni Insert without a Bond Inhibitor Coating

Comparison tests with an uncoated Ni HARMs insert were conducted using the compression molding process, as otherwise described in Example 2. When the uncoated Ni insert was used to mold Al HARMs, a small increase in the maximum molding force was observed, as shown in Table 1. Several differences in the demolding behavior of coated and uncoated Ni inserts were observed. The uncoated Ni insert extraction tensile force increased over a ~100 sec period, rather than reaching a maximum level at the beginning of insert extraction process and then decreasing continuously over a ~21 sec period to a slowly varying background level. Second, the tensile demolding force experienced by the uncoated Ni insert, about 2.5 times higher than that experienced by the coated Ni insert, led to a partial breakage of the insert attachment on the heater, resulting in an abrupt force decrease. Third, a part of the uncoated Ni insert remained attached to the Al plate after breakage. Fourth, the Ni insert was significantly bent and unsuitable for additional molding runs after manual detachment. Finally, one side of the insert had extensive Al pickup, embedding within it an entire row of the Ni microposts.

FIG. 4A shows one embodiment of an Al plate molded with an uncoated Ni insert after a single compression molding iteration. Although a microhole array was generated on the Al plate, some material was torn away from one side of each microhole near the top rim of the hole, as shown in FIG. 4B. The sidewall roughness of each microhole also increased. Material pickup also occurred on each of the Ni microposts, as shown in FIG. 4C. Al pickup was clearly observed on the Ni microposts after a single molding run, which was confirmed using scanning Auger electron spectroscopy ("SAES"), a method for determining the chemical/atomic identity of the materials on a surface with spatial selectivity. Results from the SAES show that the asymmetric damage observed both on the Al plate and the Ni insert was related to a small misalignment between the insert and the Al plate, such that the insert was not perpendicular to the Al plate when it was pressed into the Al plate, resulting in preferential insert and Al contact (i.e., uneven contact between the insert and the Al plate surfaces). Since the same misalignment existed between the coated insert and the Al plate, the results shown in FIGS. 3B, 3C, 4B, and 4C suggest that the bond inhibitor coating reduced the chemical and the mechanical interactions between the insert and Al, which increased the misalignment tolerance.

Figure 5:
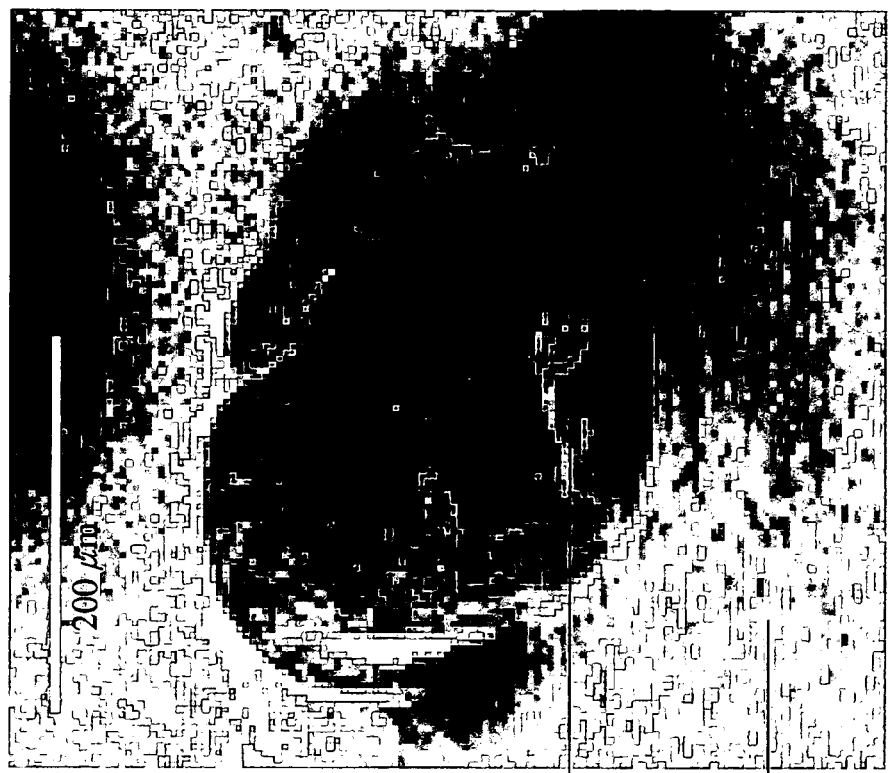
FIG. 5 is a scanning electron photomicrograph of another embodiment of an uncoated Ni mold insert.

FIG. 5 shows another embodiment of an uncoated Ni insert after compression molding. As shown in FIG. 5, a Ni micropost broke from the insert and was trapped within the microhole. This was confirmed with an SAES spectra obtained from areas 1 and 3. Ni was found inside the microhole at area 1. An Al signal, and signals from carbon and oxygen contamination were found outside the microhole at area 3. While over ten such micropost breakages were found on the uncoated Ni insert, none were found on the coated insert. (The broken microposts perhaps contained weaknesses resulting from the electrodeposition process that formed them.)

The measured maximum molding force can be converted to a maximum normal compressive stress on the Ni microposts to mold Al. This normal compressive stress measures the compression force on each Ni micropost, normalized by the cross-sectional area of each micropost, and is a measure of the force intensity required to mold the Al plate. The calculated maximum compressive stress of the entire area of contact was ~18 MPa. No perceptible shape changes in the coated microposts after molding were found. These data suggests that electrodeposited Ni inserts possess adequate strength for Al micromolding at ~450° C., which is consistent with previous yield stress measurements on electrodeposited Ni microscale specimens that showed yield stresses over 100 MPa (data not shown).

EXAMPLE 4

FIGS. 6A–6D show a schematic diagram of a fabrication sequence for the fabrication of reactive metal HARMs by high temperature compression molding of a reactive metal plate with a bond inhibitor-coated, metallic microscale mold insert 2, as described in Example 1. First, surface oxides are etched from microscale mold insert 2. Next, a precursor layer 4 is deposited onto microscale mold insert 2, as shown in 6A. Next, as shown in FIG. 6B, a thin layer of bond inhibitor 6 is deposited over precursor layer 4. Next, a metal plate 8 and the bond inhibitor-coated, microscale mold insert 2 are heated to an optimum temperature (i.e., a temperature between about 40% to about 90% of the metal plate's melting temperature), and then compressed together, as shown in FIG. 6C. Finally, microscale mold insert 2 is withdrawn from molded metal plate 8 to produce an inverse image of the microscale mold insert 2 on the molded metal plate 8, as shown in FIG. 6D.

EXAMPLE 5

Ni HARMs Insert without a Bond Inhibitor Coating

Figure 7C:
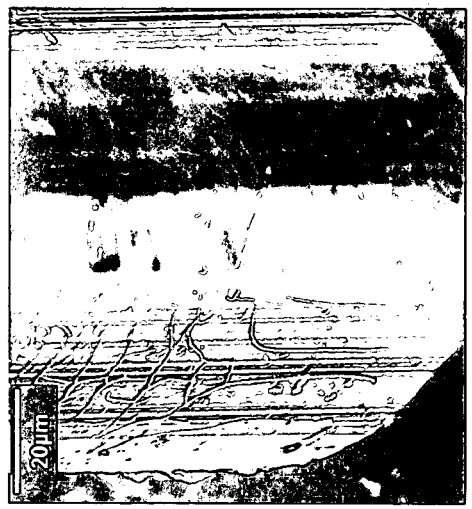
FIGS. 7A–7C are scanning electron photomicrographs of an uncoated Ni mold insert.
Figure 7B:
Figure 7A:
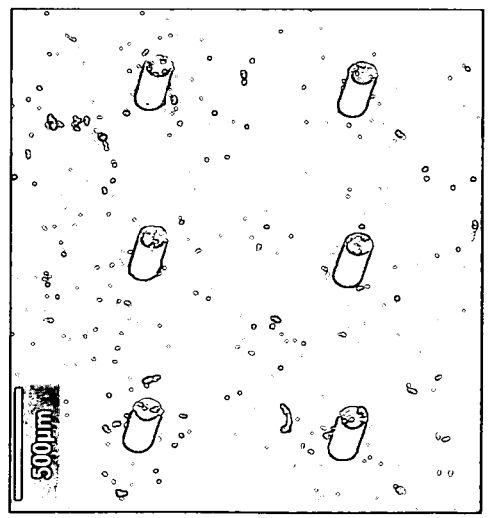

FIGS. 7A–7C show scanning electron micrographs of an uncoated Ni microscale mold insert with microposts. FIG. 7A shows a scanning electron micrograph of an uncoated Ni insert fabricated using the process described in Example 1. The insert had dimensions of approximately 500 mm×100 mm×700 mm (height, diameter, and center-to-center spacing, respectively). FIGS. 7B and 7C show a scanning electron micrograph of the top and bottom areas of the single uncoated micropost, respectively.

EXAMPLE 6

Ni HARMs Insert with a Bond Inhibitor Coating

Figures 8A, 8B, 8C:
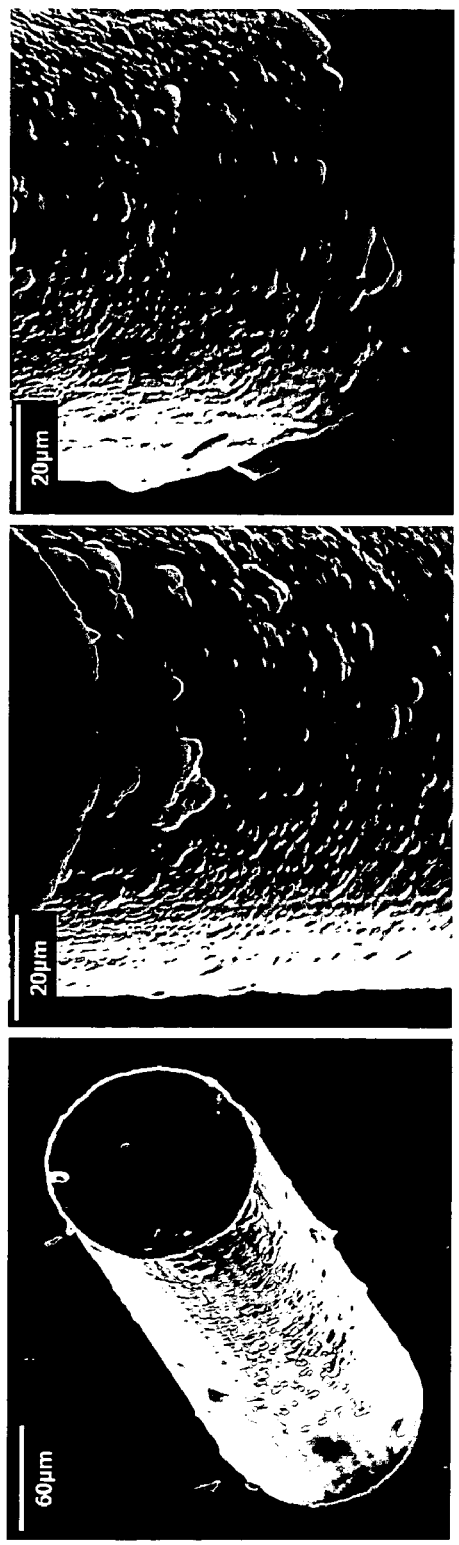
FIGS. 8A–8C show scanning electron photomicrographs of the Ni mold insert of FIGS. 7A–7C coated with a bond inhibitor layer.

FIGS. 8A–8C show scanning electron micrographs of the Ni microscale mold insert of FIGS. 7A–7C coated with a bond inhibitor layer as explained in Example 1. While some remnant striations along the micropost were visible, the finer markings along the circumferential direction of the micropost were covered with the bond inhibitor coating. Several cross sectional views of the single micropost shown in FIGS. 8A–8C, including a view perpendicular to the post, parallel to the post near the middle section, and parallel to the post at the intersection between the post and the Ni base, are shown in FIGS. 9A–9C, respectively. The bond-inhibitor coating was ~4 µm thick, and covered the microposts, the Ni-base surface between the microposts, and the micropost/Ni-base intersections.

EXAMPLE 7

Pb HARMs Fabricated using Uncoated and Coated Ni HARMs Inserts

The following Pb and Zn metal HARMs were also produced using Ni as the bulk material for the microscale mold insert. The molding temperature for both the Pb and the Zn reactive metals was 300° C.

Figure 10B:
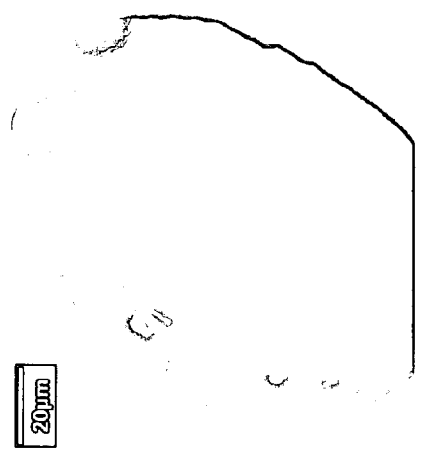
FIG. 10B is a scanning electron photomicrograph of a Pb microhole compression molded with a coated Ni mold insert.
Figure 10A:
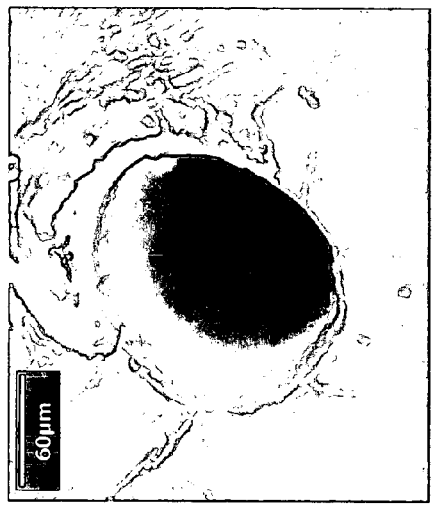
FIG. 10A is a scanning electron photomicrograph of a Pb microhole compression molded with an uncoated Ni mold insert.
Figure 10D:
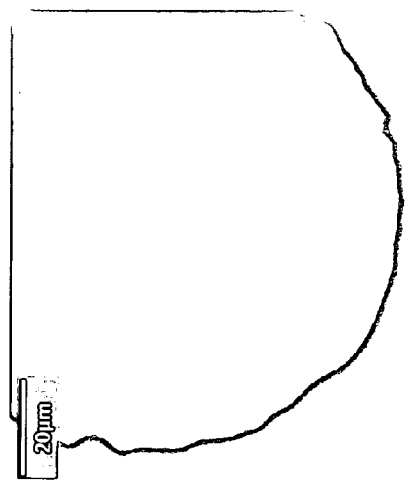
FIG. 10D is a scanning electron photomicrograph of the interior surface of the Pb microhole shown in FIG. 10B.
Figure 10C:
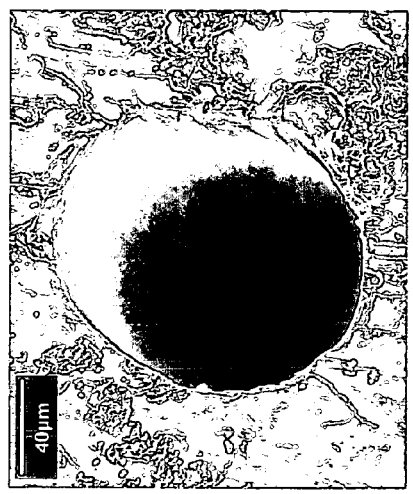
FIG. 10C is a scanning electron photomicrograph of the interior surface of the Pb microhole shown in FIG. 10A.

FIGS. 10A–10D show scanning electron micrographs of one embodiment of a single Pb microhole fabricated using the process described in Example 4. FIG. 10A shows a Pb microhole compression molded with an uncoated Ni insert. FIG. 10B shows a Pb microhole compression molded with a coated Ni insert. The inserts comprised fields of cylindrical microposts having dimensions of 100 µm×500 µm (diameter and height, respectively). Post-to-post spacings for the uncoated and coated inserts were 500 µm and 400 µm, respectively. FIG. 10C shows the interior of the Pb microhole shown in FIG. 10A. FIG. 10D shows the interior of the Pb microhole shown in FIG. 10B. The inserts had relatively smooth sidewalls and sharp bottom to sidewall transitions. In both cases, full molding was achieved with the microholes having depths approximately equaling the heights of the microposts.

Figure 11B:
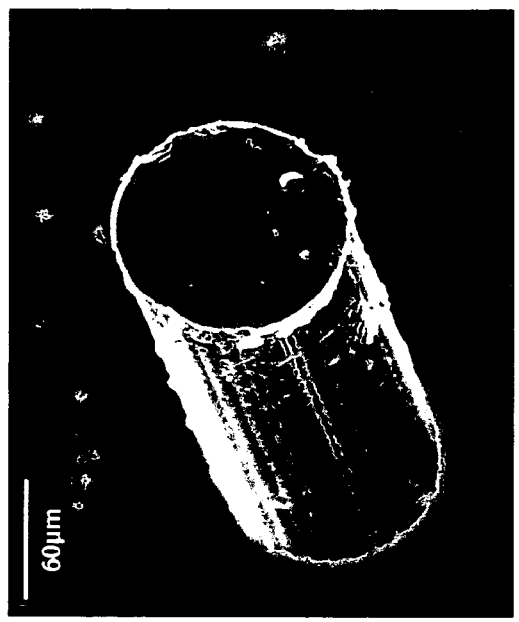
FIG. 11B is a scanning electron photomicrograph of a single micropost on a coated Ni mold insert after compression molding Pb with the insert.
Figure 11A:
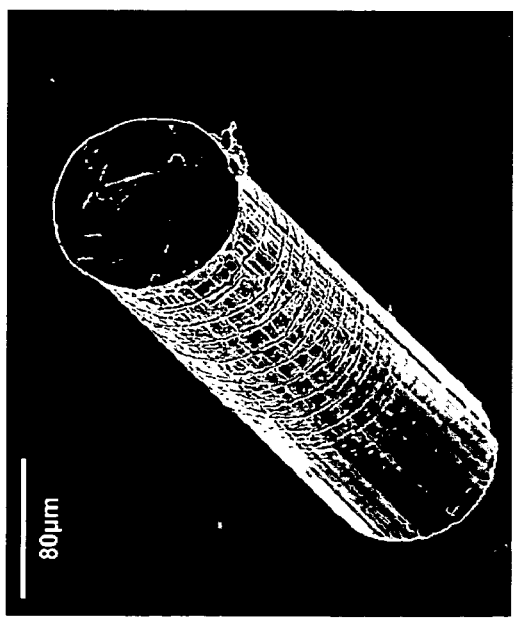
FIG. 11A is a scanning electron photomicrograph of a single micropost on an uncoated Ni mold insert after compression molding Pb with the insert.

FIGS. 11A and 11B show a single micropost on uncoated and coated Ni inserts after compression molding Pb. The chemical/atomic identity of the materials found on an area near the top rim of each micropost was determined using an X-ray energy dispersive spectroscopy ("EDS"). The results indicated that neither substantial damage nor substantial Pb pickup were observed on the uncoated or coated microposts. (Pb was unreactive to the uncoated Ni insert mainly because Pb and Ni do not have a thermodynamic driving force to bond together.) However, some Pb pickup was observed around the micropost top rim in both cases. Repeated molding cycles did not cause any noticeable change or degradation to the inserts.

EXAMPLE 8

Zn HARMs Fabricated Using Uncoated Ni HARMs Inserts

Figure 12B:
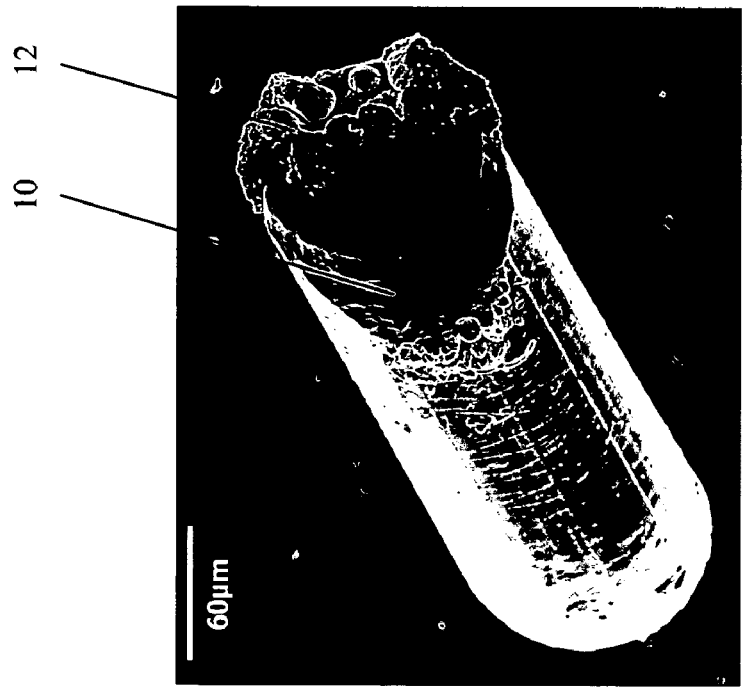
FIG. 12B is a scanning electron photomicrograph of single micropost from the array of microposts shown in FIG. 12A.
Figure 12A:
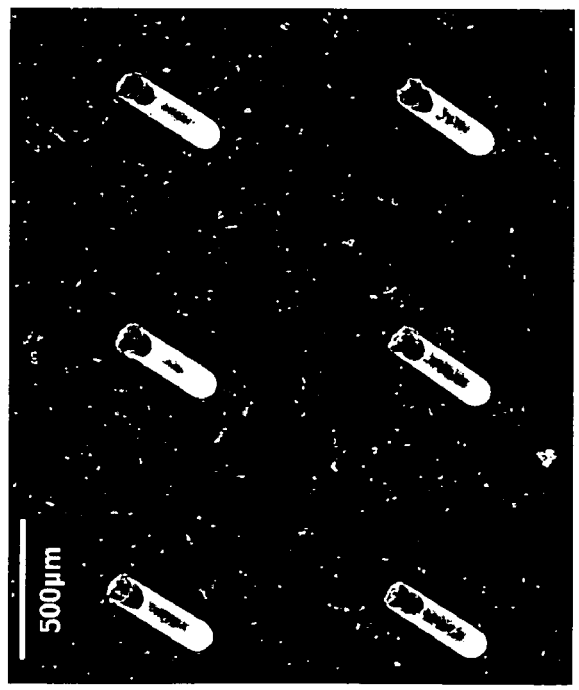
FIG. 12A is a scanning electron photomicrograph of an array of microposts on an uncoated Ni mold insert after compression molding Zn with the insert.

FIG. 12A and 12B show scanning electron micrographs of an uncoated Ni insert after compression molding Zn, using the process as described in Example 4. FIG. 12A shows an array of microposts having a diameter of 100 µm and a post-to-post spacing of 800 µm. FIG. 12B shows a magnified view of a single micropost. Substantial Zn pickup at the post side-wall area, marked as area 12, and damage to the post top region area, marked as area 10, were observed on the Ni micropost. Results from an EDS spectrum of areas 12 and 10 showed that Zn was present at area 12 and Ni at area 10. The exposure of Ni at area 10 likely occurred when a piece of the original Ni micropost was torn away during the demolding process as a result of a chemical reaction between the uncoated Ni insert and the molded Zn metal.

Figure 13B:
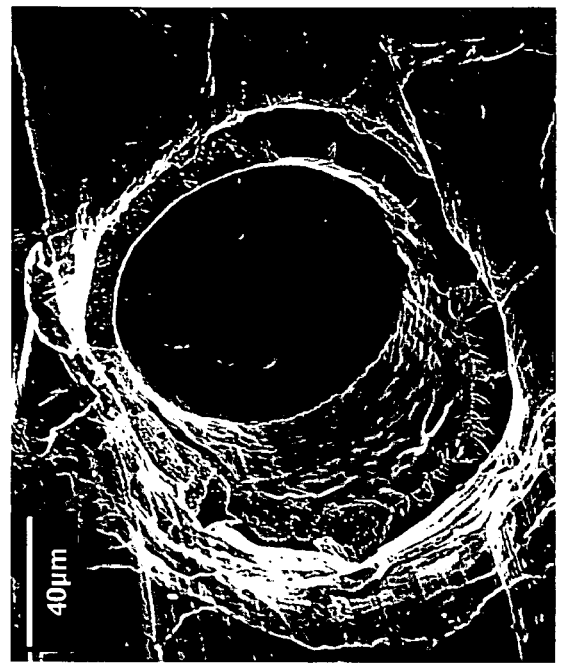
FIG. 13B is a scanning electron photomicrograph of a single microhole from the array of microholes shown in FIG. 13A.
Figure 13A:
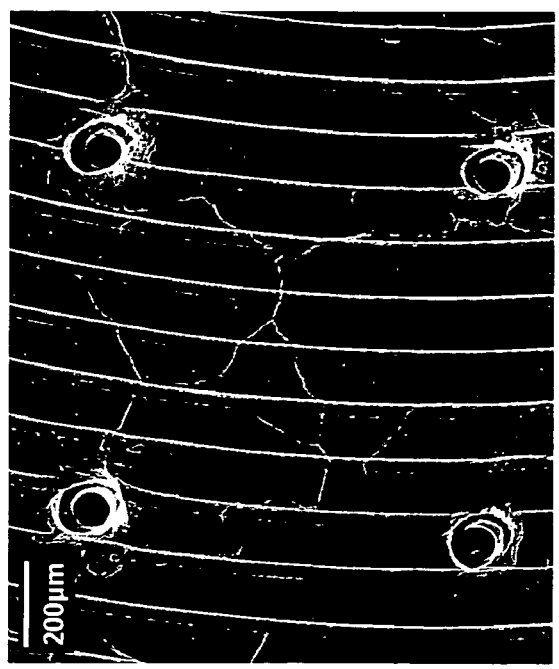
FIG. 13A is a scanning electron photomicrograph of an array of microholes in Zn fabricated by compression molding with an uncoated Ni mold insert.

FIGS. 13A shows a scanning electron micrograph of an array of microholes in Zn after compression molding with an uncoated Ni insert, using the process described in Example 4. FIG. 13B shows the interior of a single microhole. In contrast to the Pb microholes fabricated using uncoated Ni inserts, as described in Example 7, molding of Zn plates using uncoated Ni inserts caused substantial disruptions on the microhole sidewall surface. The Zn reacted with the uncoated Ni microposts during the molding process, damaging the micropost, and causing Zn pickup on the micropost, in addition to sidewall disruptions. See also FIGS. 12A and 12B.

EXAMPLE 9

Zn HARMs Fabricated using Coated Ni HARMs Substrates

Figure 14B:
FIGS. 14A and 14B are scanning electron photomicrographs of a single micropost on a coated Ni mold insert after compression molding Zn with the insert.
Figure 14A:
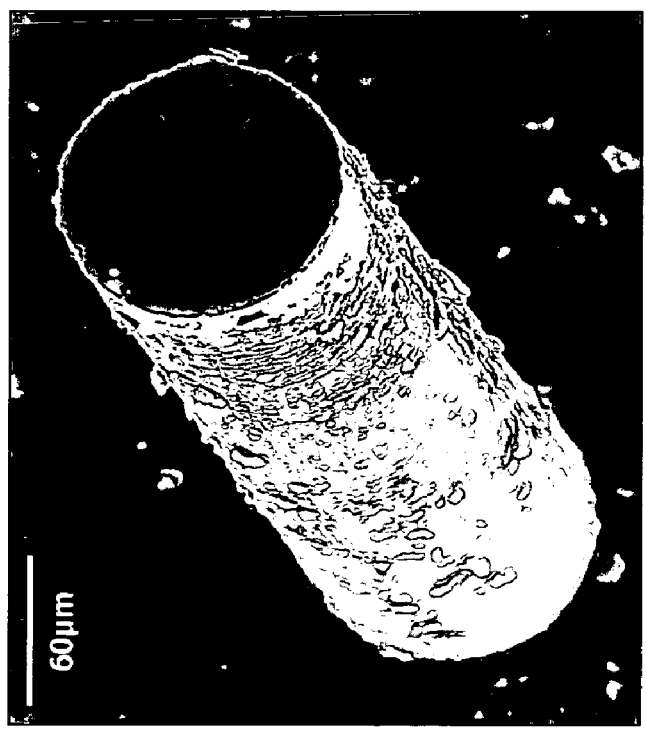

FIGS. 14A and 14B show a single micropost on a coated Ni insert after compression molding Zn, using the process described in Example 4. Minimum damage to the post top region and Zn pickup were observed. Results from an EDS spectrum of the top rim region and main portion of the micropost showed some Zn pickup at the top region, but not on the main portion of the micropost. Some coating oxidation was also found on the micropost.

Figure 15B:
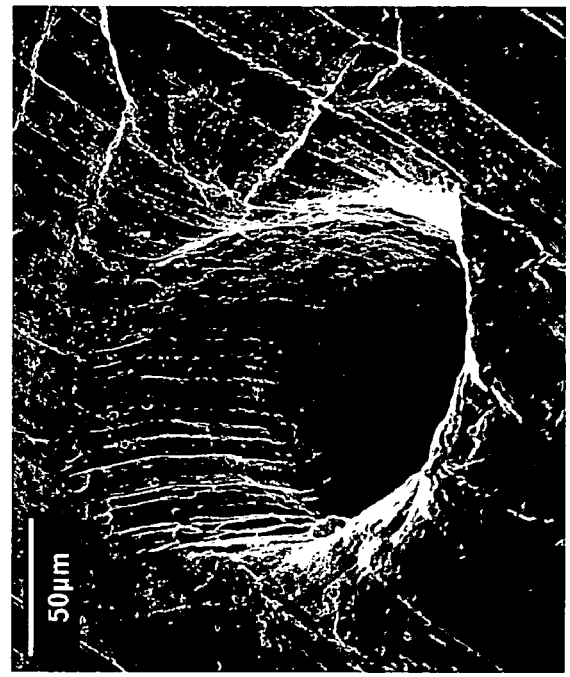
FIG. 15B is a scanning electron photomicrograph of a single microhole from the array of microholes shown in FIG. 15A.
Figure 15A:
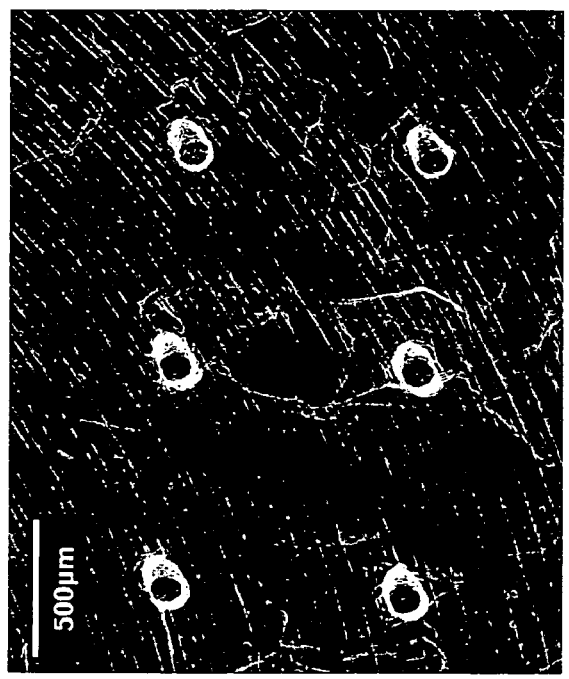
FIG. 15A is a scanning electron photomicrograph of an array of microholes in Zn fabricated by compression molding with a coated Ni mold insert.

FIG. 15A shows a scanning electron micrograph of an array of microholes in Zn after compression molding with a coated Ni insert, using the molding process described in Example 4. FIG. 15B shows the interior of one of the microholes with relatively smooth sidewalls. Although only partial molding of Zn was achieved, the Ni mold inserts coated with the bond inhibitor were effective in molding Zn.

According to these experiments, although LIGA fabricated Ni inserts can withstand the compressive stresses required to compression mold metal HARMs without shape change, the application of a bond-inhibitor coating onto Ni inserts allows repetitive micromolding of reactive metals, such as Zn and Al, without damaging either the insert or the molded microfeatures on the metal. Molding reactive metals with uncoated Ni inserts can cause substantial damage to the insert and the molded microscale features, depending on the metal.

The complete disclosures of all references cited in this specification are hereby incorporated by reference. Also incorporated by reference are the complete disclosures of the following papers: Cao et al., "Microscale Compression Molding of Al with Surface Engineered LIGA Inserts" (submitted for publication in September 2003); and Cao et al., "Molding of Pb and Zn with Microscale Mold Inserts" (presented at the Materials Research Society Meeting in Boston, Massachusetts in December 2002). In the event of an otherwise irreconcilable conflict, however, the present specification shall control.

I claim:

1. A method for the producing substantially identical microscale metal or metal alloy structures, said method comprising the steps of:
   (a) fabricating a microscale mold insert having a size and shape that are generally complementary to the size and shape of the desired microscale structures;
   (b) etching away surface oxides, if any, from the microscale mold insert;
   (c) coating the microscale mold insert with a bond inhibitor layer;
   (d) heating a metal plate or a metal alloy plate and the microscale mold insert to a temperature between about 40% and about 90% of the melting point of the plate;
   (e) pressing the heated plate and the heated microscale mold insert together to form an inverse image of the microscale mold insert in the plate; wherein the inverse image is complementary to the microscale mold insert to an accuracy within about 10 microns;
   (f) repeating steps (d) and (e) a plurality of times using the same or a different coated microscale mold insert to produce a plurality of substantially identical high aspect ratio microscale metal or metal alloy structures.

2. A method as recited in claim 1, additionally comprising the step of coating the microscale mold insert with a precursor layer; wherein the precursor layer promotes adhesion between the microscale mold insert and the bond inhibitor-layer.

3. A method as recited in claim 2, wherein the precursor layer is selected from the group consisting of Ti, Cr, and W.

4. A method as recited in claim 3, wherein the precursor layer comprises Ti.

5. A method as recited in claim 2, wherein the precursor layer is deposited by sputtering.

6. A method as recited in claim 2, wherein the precursor layer is deposited by evaporation deposition.

7. A method as recited in claim 2, wherein the precursor layer is deposited by chemical vapor deposition.

8. A method as recited in claim 1, wherein the bond inhibitor layer is selected from the group consisting of amorphous hydrocarbons, metal-containing amorphous hydrocarbons, amorphous silicon nitrides, metal-containing silicon nitrides, diamonds, metal carbides, metal borides, and metal nitrides.

9. A method as recited in claim 1, wherein the bond-inhibitor layer is deposited by sputtering.

10. A method as recited in claim 1, wherein the bond inhibitor layer is deposited by evaporation deposition.

11. A method as recited in claim 1, wherein the bond-inhibitor layer is deposited by hybrid physical/chemical vapor deposition.

12. A method as recited in claim 1, wherein the metal plate comprise a metal or metal alloy selected from the group consisting of Zn, Al, Al-alloys, Cu, Ni, Fe, and Ni—Fe alloys.

13. A method as recited in claim 1, wherein the metal plate comprises Al.

14. A method as recited in claim 1, wherein the metal plate comprises an Al-alloy.

15. A method as recited in claim 1, wherein the metal plate comprises Zn.

16. A method as recited in claim 1, wherein the inverse image is complementary to the microscale mold insert to an accuracy of less than about 1 micron.

* * * * *

UNITED STATES PATENT AND TRADEMARK OFFICE
CERTIFICATE OF CORRECTION

| | |
|---|---|
| PATENT NO. | : 7,114,361 B2 |
| APPLICATION NO. | : 10/660926 |
| DATED | : October 3, 2006 |
| INVENTOR(S) | : Wen Jin Meng |

It is certified that error appears in the above-identified patent and that said Letters Patent is hereby corrected as shown below:

Col. 1, line 4, insert:    --The development of this invention was partially funded by the Government under Grant No. DMI-012441 from the National Science Foundation. The Government has certain rights in this invention.--

Signed and Sealed this

Seventh Day of August, 2007

JON W. DUDAS
*Director of the United States Patent and Trademark Office*